United States Patent [19]

Mulder

[11] Patent Number: 5,485,124
[45] Date of Patent: Jan. 16, 1996

[54] INTEGRATED AMPLIFIER WITH AN ACCURATELY DEFINED GAIN FACTOR

[75] Inventor: Jacob Mulder, Eindhoven, Netherlands

[73] Assignee: U.S. Philips Corporation, New York, N.Y.

[21] Appl. No.: 254,091

[22] Filed: Jun. 6, 1994

[30] Foreign Application Priority Data

Jun. 4, 1993 [EP] European Pat. Off. ............. 93201607

[51] Int. Cl.⁶ .................................................. H03G 3/30
[52] U.S. Cl. ........................................... 330/278; 330/254
[58] Field of Search ................................... 330/254, 261, 330/278, 279, 307

[56] References Cited

U.S. PATENT DOCUMENTS

| | | | |
|---|---|---|---|
| 4,290,025 | 9/1981 | van de Plassche | 330/254 |
| 4,489,282 | 12/1984 | Jett, Jr. | 330/261 |
| 5,325,070 | 6/1994 | McGinn | 330/303 X |

FOREIGN PATENT DOCUMENTS 4101892  7/1992  Germany.

*Primary Examiner*—Steven Mottola
*Attorney, Agent, or Firm*—Laurie E. Gathman

[57] ABSTRACT

The invention provides an integrated amplifier whose gain factor is adjusted by means of an auxiliary amplifier. The gain factor is determined by the ratio of two on-chip resistors and by the ratio of the dimensions of transistors in long-tailed pair circuits in the signal amplifier to those of the transistors in the long-tailed pair circuit in the auxiliary amplifier. Both resistance ratios and ratios between complete circuits can be realised highly accurately in integrated circuits. As a result, the accuracy of the gain factor is great. In an embodiment of the invention the dimensions of the long-tailed pair circuits in the auxiliary amplifier and in the signal amplifier are the same. This achieves that if the adjusting voltages and adjusting currents of corresponding transistors in the long-tailed pair circuits are the same, the gain factor is over a large range independent of supply voltage and temperature.

3 Claims, 2 Drawing Sheets

INTEGRATED AMPLIFIER WITH AN ACCURATELY DEFINED GAIN FACTOR

BACKGROUND OF THE INVENTION

1. Field of the Invention

The invention relates to an integrated amplifier comprising an auxiliary amplifier which includes a first long-tailed pair circuit having an input for receiving an auxiliary voltage, a signal amplifier which includes at least a second long-tailed pair circuit having an input for receiving a signal voltage to be amplified, and adjusting means for adjusting, via a tail current from at least the second long-tailed pair circuit, a gain factor of the signal amplifier in response to the value of an output current of the first long-tailed pair circuit.

An integrated amplifier of this type may be used, for example, as a microphone preamplifier in a transmission IC for wire telephony. In that field there is an important requirement that the gain factor be accurately defined.

2. Description of the Prior Art

An integrated amplifier as described in the opening paragraph is known from U.S. Pat. No. 4,489,282. In the amplifier described in that document the output current of the first long-tailed pair circuit is compared with an external reference current. The tail current of one or more long-tailed pair circuits in the signal amplifier is adjusted on the basis of the difference between these currents. The external reference current is dependent on an off-chip resistor. External resistors can be obtained with any desired accuracy. This provides great accuracy of the gain factor to be adjusted. A drawback of the amplifier described in that document is that it is not fully integrable and, therefore, relatively expensive due to the presence of the off-chip resistor.

SUMMARY OF THE INVENTION

It is an object of the invention to provide an integrated amplifier of the type defined in the opening paragraph in which said drawback is obviated and which can be realised in a simple and cost-effective manner while an accurately defined gain factor is retained. An amplifier having an accurate gain factor can be realised, it is true, by adjusting the gain factor with two or four resistors in known manner. A drawback of this is that if a high input impedance is desired, which is the case for a microphone preamplifier, the noise of the resistors starts playing a role that cannot be discarded.

An integrated amplifier according to the invention is therefore characterized in that the adjusting means comprise a first current-voltage converter coupled to the first long-tailed pair circuit for converting, by means of a first resistor, the output current of the first long-tailed pair circuit to an output voltage of the auxiliary amplifier and comprise a comparator element for comparing a voltage proportional to the auxiliary amplifier output voltage with a voltage proportional to the auxiliary voltage, the output of the comparator element being coupled to control electrodes of tail current transistors of the long-tailed pair circuits in the auxiliary amplifier and the signal amplifier, and in that the at least second long-tailed pair circuit is coupled to a second current-voltage converter for converting an output current of the at least second long-tailed pair circuit to an output voltage of the signal amplifier by means of a second resistor.

The accuracy of the gain factor of the amplifier is determined by the ratio between the second and the first resistance and by the ratio of the dimensions of the transistors in the long-tailed pair circuits in the signal amplifier to those of the transistors in the long-tailed pair circuit in the auxiliary amplifier. This gain factor is accurately defined because resistance ratios or ratios of complete on-chip circuits can be realised with great accuracy. Since all the elements of the amplifier are manufactured in a fully integrated manner, the amplifier is relatively low priced.

An embodiment of the integrated amplifier is therefore characterized in that the signal amplifier comprises a plurality of parallel-arranged long-tailed pair circuits whose transistors have the same dimensions as the transistors in the long-tailed pair circuit in the auxiliary amplifier and whose outputs are coupled to the second current-voltage converter.

This integrated amplifier can be easily manufactured because all long-tailed pair circuits are the same. Since corresponding transistors in the auxiliary amplifier and signal amplifier have the same dimensions, adjusting voltages and adjusting currents, the gain factor will over a large range be independent of the supply voltage.

The invention will be further explained with reference to a drawing in which:

DETAILED DESCRIPTION OF THE PREFERRED EMBODIMENTS

Figure 1:
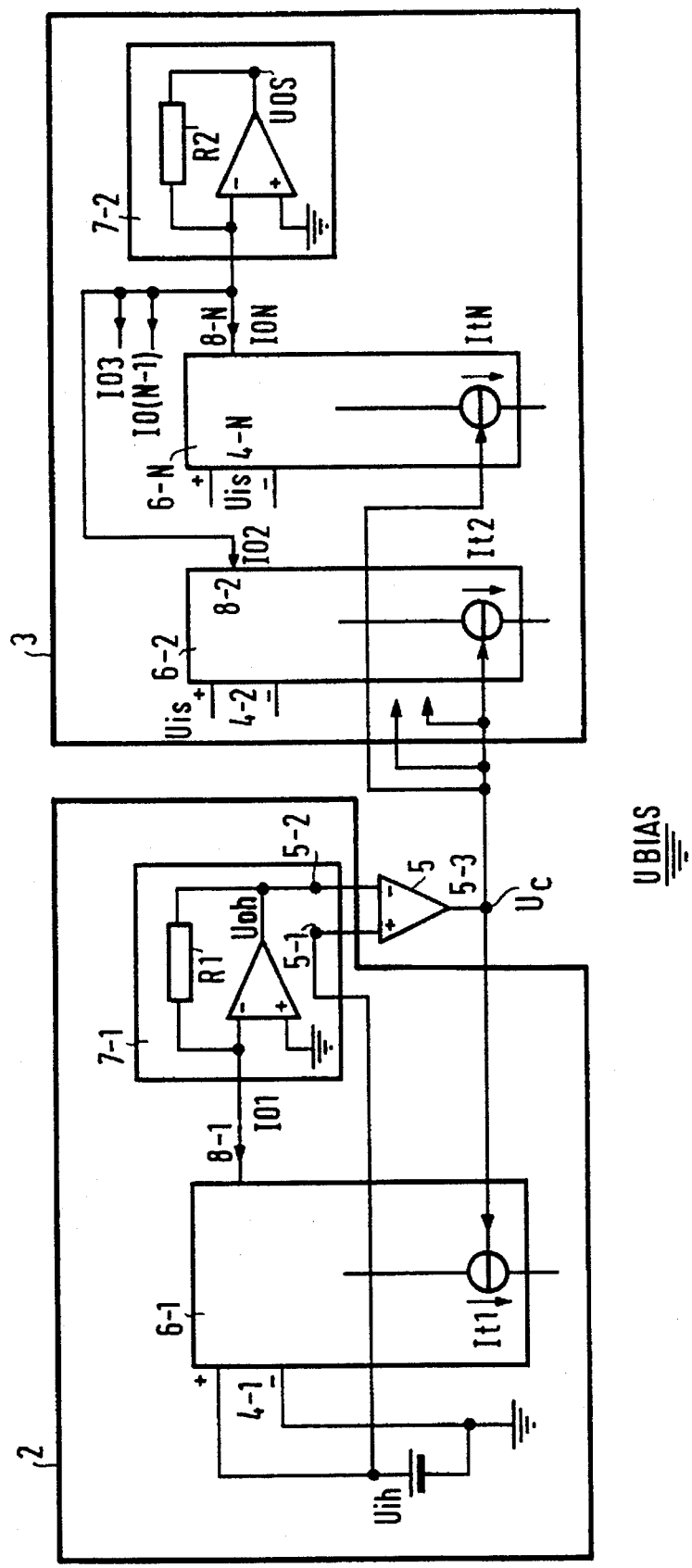
FIG. 1 shows an integrated amplifier according to the invention.
Figure 2:
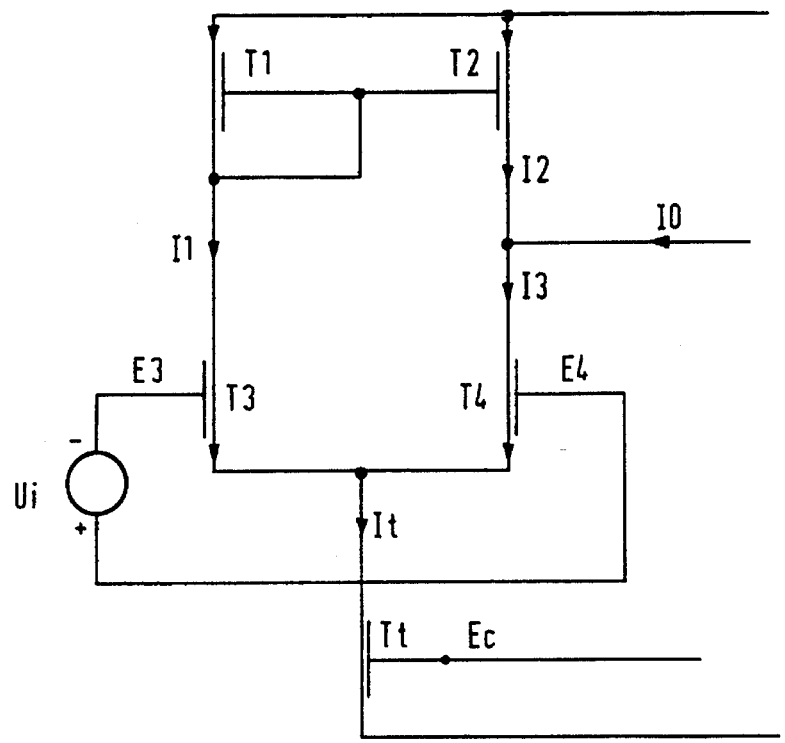
FIG. 2 shows a general diagram of a long-tailed pair circuit in detail.
Figure 3:
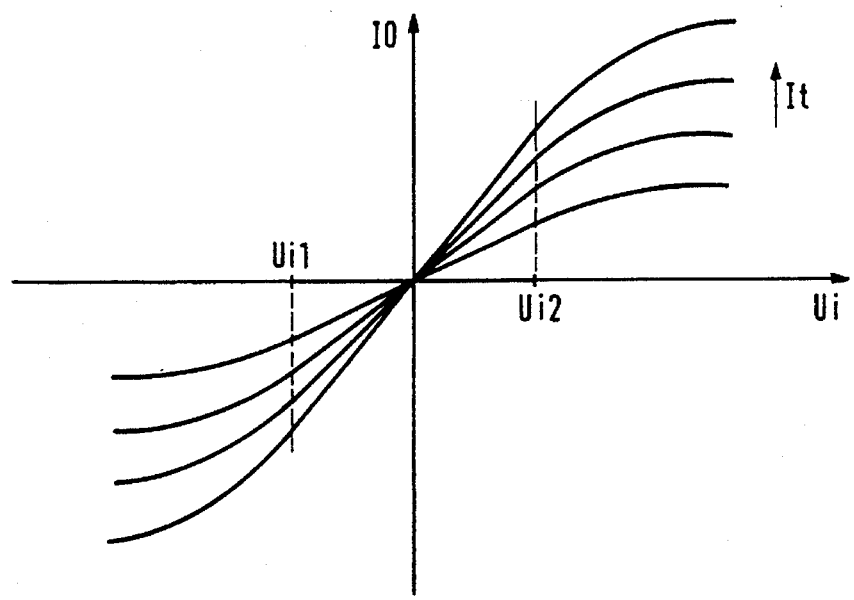
FIG. 3 shows how the input and output variables of a long-tailed pair circuit are mutually related.

FIG. 1 shows an integrated amplifier according to the invention, which comprises both an auxiliary amplifier 2 and a signal amplifier 3. The auxiliary amplifier 2 includes a first long-tailed pair circuit 6-1 having an input 4-1 for receiving an auxiliary voltage Uih and an output 8-1 on which an output current I01 is present. FIG. 2 shows a general diagram of a long-tailed pair circuit 6 in detail. There should be observed that this is only one of the possibilities of arranging such a circuit. The transistors T1 and T2 have the same dimensions as transistors T3 and T4. They are connected in such a way that current I1 is as equally large as I2. By applying an input voltage Ui between the control electrodes EA and E3 of the transistors T4 and T3, a current I3 will start flowing through transistor T4 which is larger than the current I1 flowing through transistor T3. The difference between the two currents I3 and I2 is output current I0. The transconductance $g_m$ of the long-tailed pair circuit 6 is equal to $dI_o/dU_i$ by definition. The tail current It determines how large the currents flowing through the long-tailed pair circuit 6 are. The magnitude of this tail current It may be affected by adjusting a tail current transistor Tt by a control electrode Ec. As a result, the magnitude of the transconductance $g_m$ is affected. FIG. 3 shows how the input and output parameters of the long-tailed pair circuit 6 are mutually related. When the circuit is adjusted between the input voltages Ui1 and Ui2, the output current I0 linearly depends on the input voltage Ui. In this range, called the linear range, the transconductance $g_m$ is thus equal to I0/Ui. Since the curve runs through the origin, the transconductance $g_m$ in the linear range is constant. The magnitude of this transconductance $g_m$ depends on the quantity of the tail current It and, in the case where MOS transistors are used, the width-to-length ratio of the transistors in the long-tailed pair circuit 6.

As shown in FIG. 1, the output 8-1 of the first long-tailed pair circuit 6-1 (the second digit in the reference number designating which long-tailed pair circuit shown in FIG. 1 is discussed) is coupled to a first current-voltage converter 7-1 for converting an output current I01 of the first long-tailed pair circuit 6-1 to an output voltage Uoh of the auxiliary amplifier 2 by means of a first resistor R1. A comparator element 5 compares this output voltage Uoh or a voltage related thereto and obtained, for example, by means of a voltage divider, with the auxiliary voltage Uih applied to the first long-tailed pair circuit 6-1, or with a voltage related thereto and likewise obtained, for example, by means of a voltage divider (not shown). In response to an output voltage Uc of the comparator element 5 a tail current It1 of the first long-tailed pair circuit 6-1 is controlled, so that the transconductance $g_{m1}$ of the first long-tailed pair circuit 6-1 is affected. As long as the auxiliary voltage Uih or the voltage related thereto exceeds the output voltage Uoh of the auxiliary amplifier 2 or the voltage related thereto, the tail current It1 and hence also the transconductance $g_{m1}$ and the output current I01 of the first long-tailed pair circuit 6-1 increase. As a result, also the output voltage Uoh of the auxiliary amplifier 2 or the voltage related thereto increases. This process is continued until the voltages on the inputs 5-1 and 5-2 of the comparator element 5 have equal values. If the output voltage Uoh of the auxiliary amplifier 2 or the voltage related thereto exceeds the auxiliary voltage Uih or the voltage related thereto, the tail current It1 is reduced, so that the transconductance $g_{m1}$ and the output current I01 of the first long-tailed pair circuit 6-1 and hence also the output voltage Uoh of the auxiliary amplifier 2 decrease. This process too is continued until the voltages on the inputs 5-1 and 5-2 of the comparator element 5 are equal. In this state of balance the gain factor $A_h$ of the auxiliary amplifier 2 assumes a specific value. If the output voltage Uoh of the auxiliary voltage Uih as shown in the drawing Figure are directly applied to the comparator element 5, this gain factor $A_h$ =1. This means that in this case $g_{m1}$ =1/R1 holds for the transconductance $g_{m1}$ of the first long-tailed pair circuit 6-1, which is equal to I01/Uih in the linear range. With respect to FIG. 2 there can be observed that the auxiliary voltage Uih need not be accurate. The auxiliary voltage Uij to be supplied should not be selected too large, because otherwise the transconductance $g_{m1}$ ends up outside the linear range. Too small a value of the auxiliary voltage Uij is not desired either, because in that case undesired effects such as the input offset voltage may start playing too large a role. This effect may be eliminated by reversing the polarity of the input voltage Ui and changing the switching mode of the transistors T1 and T2 with a certain frequency as described in the publication "Dual Tone and Modem Frequency Generator with On-Chip Filters and Voltage Reference" by Walter Oswald and Jaap Mulder in "IEEE Journal of Solid State Circuits, Vol. SC-19, No. 3" June 1984.

The operation of the signal amplifier 3 is similar to that of the auxiliary amplifier 2. The signal voltage U is to be amplified is applied to the inputs 4-2 . . . 4-N of the long-tailed pair circuits 6-2 . . . 6-N in the signal amplifier 3. The outputs of these long-tailed pair circuits 6-2 . . . 6-N are coupled to a second current-voltage converter 7-2 for converting output currents I02, I0N of the long-tailed pair circuits 6-2 . . . 6-N to an output voltage UOS of the signal amplifier 3 by means of a second resistor R2.

The output voltage Uc of the comparator element 5 is also used for controlling one or more tail currents It2 . . . ItN of long-tailed pair circuits 6-2 . . . 6-N in the signal amplifier 3. This is effected to adjust the transconductances $g_{m1}$ . . . $g_{mN}$ of the long-tailed pair circuits 6-2 . . . 6-N and hence the gain factor As of the signal amplifier 3. As for this structure the long-tailed pair circuits 6-2 . . . 6-N in the signal amplifier 3 are identical with the long-tailed pair circuit 6-1 in the auxiliary amplifier 2. Only the dimensions of the transistors in the long-tailed pair circuits 6-2 . . . 6-N may be different from the dimensions of the transistors in the first long-tailed pair circuit 6-1. The ratio of input to output values of each long-tailed pair circuit 6-2 . . . 6-N in the signal amplifier 3 shows the same variation as the ratio of the input to output values of the first long-tailed pair circuit 6-1 as shown in FIG. 2, because these circuits are all of identical structure. Only the slopes of the curves may differ as a result of differences in dimensions of the transistors in the various circuits.

Since the long-tailed pair circuits 6-1 . . . 6-N are all deposited on the same chip, their properties are mutually equal to within narrow limits. Since the structure of all the long-tailed pair circuits 6-1 . . . 6-N is the same, an adjustment of the transconductance $g_{m1}$ of the first long-tailed pair circuit 6-1 of the auxiliary amplifier 2 results in the transconductances $g_{m2}$ . . . $g_{mN}$ of the long-tailed pair circuits 6-2 . . . 6-N of the signal amplifier 3 bein adjusted to within the same range. The transconductances $g_{m2}$ . . . $g_{mN}$ per se cannot be made accurate, because they depend on the on-chip resistor R1, but by supplying the output currents I02 . . . I0N of the long-tailed pair circuits 6-2 . . . 6-N from the signal amplifier 3 to a second current-voltage converter 7-2 for conversion to an output voltage U0S of the signal amplifier 3 by means of a second on-chip resistor R2, the gain factor As of this signal amplifier 3 is solely made dependent on the resistance ratio R2/R1 and on the ratio of the dimensions of the transistors in the long-tailed pair circuits 6-2 . . . 6-N in the signal amplifier 3 to those of the transistors in the long-tailed pair circuit 6-1 in the auxiliary amplifier 2. Since the resistors R1 and R2 are manufactured in a same process, their ratio is accurately reproducible. Ratios of complete circuits are likewise accurately reproducible on-chip, so that the invention provides an integrated amplifier whose gain factor As is accurately defined. The noise, if any, generated in the auxiliary amplifier 2 is applied to the signal amplifier 3 in common mode and thus strongly suppressed.

Highly advantageous is the embodiment in which all long-tailed pair circuits 6-2 . . . 6-N in the signal amplifier 3 are exactly the same as the first long-tailed pair circuit 6-1 in the auxiliary amplifier 2. In that case there are no differences in transistor dimensions in the long-tailed pair circuits 6-1 . . . 6-N, which provides that the integrated amplifier can easily be made accurate. In this embodiment the gain factor As of the signal amplifier 3 is over a large range independent of the supply voltage and temperature.

What is claimed is:
1. An integrated amplifier comprising:
  an auxiliary amplifier which includes a first long-tailed pair circuit having an input for receiving an auxiliary voltage and tail current transistors each having a control electrode;
  a signal amplifier which includes at least a second long-tailed pair circuit having an input for receiving a signal voltage to be amplified and tail current transistors each having a control electrode; and
  adjusting means for adjusting, via a tail current from the at least a second long-tailed pair circuit, a gain factor of the signal amplifier in response to the value of an output current of the first long-tailed pair circuit, the adjusting means including i) a first on-chip resistor, ii) a second on-chip resistor, iii) a first current-voltage converter coupled to the first long-tailed pair circuit for converting, by means of the first on-chip resistor, the output current of the first long-tailed pair circuit to an output voltage of the auxiliary amplifier and iv) a comparator element for comparing a voltage proportional to the output voltage of the auxiliary amplifier with a voltage proportional to the auxiliary voltage, the output of the comparator element being coupled to the control electrodes of the tail current transistors of the long-tailed pair circuits in the auxiliary amplifier and the signal amplifier, and in that the at least a second long tailed pair circuit is coupled to a second current-voltage converter for converting an output current of the at least second long-tailed pair circuit to an output voltage of the signal amplifier by means of the second on-chip resistor which output voltage is dependent upon a ratio of the resistance of the second on-chip resistor to the resistance of the first on-chip resistor.

2. Integrated amplifier as claimed in claim 1, characterized in that the signal amplifier comprises a plurality of parallel-arranged long-tailed pair circuits whose transistors have the same dimensions as the transistors in the long-tailed pair circuit in the auxiliary amplifier and whose outputs are coupled to the second current-voltage converter.

3. An integrated amplifier comprising:

an auxiliary amplifier having a first transconductance and a first on-chip resistor;

a signal amplifier coupled to the auxiliary amplifier and including a second on-chip resistor and a plurality of further amplifiers each amplifier of the plurality of further amplifiers having a respective transconductance dependent upon the first transconductance and each amplifier of the plurality of further amplifiers is for supplying respective output currents, and wherein the second on-chip resistor is for receiving the respective output currents and for providing an accurate output voltage that is dependent on a ratio of the second resistance to the first resistance.

* * * * *